US012772599B2

(12) United States Patent
Yoshioka

(10) Patent No.: US 12,772,599 B2
(45) Date of Patent: Oct. 20, 2026

(54) SEMICONDUCTOR ELEMENT AND TERAHERTZ WAVE SYSTEM

(71) Applicant: Canon Kabushiki Kaisha, Tokyo (JP)

(72) Inventor: Takeshi Yoshioka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 425 days.

(21) Appl. No.: 18/479,867

(22) Filed: Oct. 3, 2023

(65) Prior Publication Data

US 2024/0120425 A1 Apr. 11, 2024

(30) Foreign Application Priority Data

Oct. 6, 2022 (JP) ................................ 2022-161832
Aug. 3, 2023 (JP) ................................ 2023-127328

(51) Int. Cl.

*H10F 77/14* (2025.01)
*G01J 5/20* (2006.01)
*H10H 20/812* (2025.01)
*H10H 20/831* (2025.01)
*H10W 20/20* (2026.01)

(52) U.S. Cl.

CPC .............. *H10F 77/147* (2025.01); *G01J 5/20* (2013.01); *H10H 20/831* (2025.01); *H10W 20/20* (2026.01); *H10F 77/146* (2025.01); *H10H 20/812* (2025.01)

(58) Field of Classification Search

CPC .... H10F 77/147; H10F 77/146; H10F 77/206; G01J 5/20; G01J 2005/204; G01J 3/42; H01L 23/481; H01L 23/66; H10H 20/831; H10H 20/812; H10W 20/20; H10W 44/20

See application file for complete search history.

(56) References Cited

U.S. PATENT DOCUMENTS 11,011,663 B2 * 5/2021 Koyama ............... H10F 77/143
2018/0152141 A1 5/2018 Koyama (Continued)

FOREIGN PATENT DOCUMENTS

JP 2009524242 A 6/2009
JP 2017-005690 A 1/2017

(Continued)

OTHER PUBLICATIONS

Japanese Office Action dated Jun. 15, 2026 in counterpart Japanese Patent Appln. No. 2023-127328.

*Primary Examiner* — Jonathan Han
(74) *Attorney, Agent, or Firm* — Venable LLP

(57) ABSTRACT

A semiconductor element for generating or detecting a terahertz wave is provided. The element includes a substrate, a first electrode, a semiconductor layer disposed between the substrate and the first electrode and including a gain medium for the terahertz wave, a dielectric layer disposed to cover the substrate, and a second electrode disposed on the dielectric layer and connected to the first electrode via an opening provided in the dielectric layer. A portion of the second electrode disposed in the opening includes a first inclined portion, a second inclined portion disposed between the first inclined portion and the first electrode and is less inclined than the first inclined portion, and an intermediate portion connecting the first and second inclined portions. The intermediate portion includes a planar terrace and the terrace is less inclined than the first and second inclined portions.

22 Claims, 8 Drawing Sheets

(56) References Cited

U.S. PATENT DOCUMENTS

| | | | | |
|---|---|---|---|---|
| 2020/0111929 | A1* | 4/2020 | Koyama | H10F 30/21 |
| 2020/0176421 | A1* | 6/2020 | Saito | H01L 24/27 |
| 2020/0395274 | A1* | 12/2020 | Saito | H01L 21/30655 |
| 2023/0246112 | A1* | 8/2023 | Uchida | H10D 62/824<br>257/25 |
| 2023/0387563 | A1* | 11/2023 | Kim | H01P 3/12 |

FOREIGN PATENT DOCUMENTS

| | | | |
|---|---|---|---|
| JP | 2020-057739 | A | 4/2020 |
| JP | 2020088292 | A | 6/2020 |

* cited by examiner

SEMICONDUCTOR ELEMENT AND TERAHERTZ WAVE SYSTEM

BACKGROUND OF THE INVENTION

Field of the Invention

The present invention relates to a semiconductor element and a terahertz wave system.

Description of the Related Art

Development of oscillators and detectors for imaging systems and high-speed wireless communication systems in which terahertz waves are used is in progress. A terahertz wave may be defined as an electromagnetic wave having a frequency greater than or equal to 30 GHz and less than or equal to 30 THz. Japanese Patent Laid-Open No. 2020-057739 describes a semiconductor element for generating or detecting terahertz waves and in which a patch antenna is integrated on a resonant tunneling diode (RTD).

SUMMARY OF THE INVENTION

In the semiconductor element described in Japanese Patent Laid-Open No. 2020-057739, a dielectric layer is disposed so as to cover the RTD, a via hole for exposing the RTD is provided in the dielectric layer, and an electrode for connecting to an external power source is disposed in the via hole. In a structure described in Japanese Patent Laid-Open No. 2020-057739, it is necessary to thicken the dielectric layer in order to improve radiation efficiency (reception efficiency). If an inclination of the via hole formed in the dielectric layer is gentle for a thick dielectric layer, terahertz wave radiation efficiency (reception efficiency) will decrease due to parasitic capacitance. Meanwhile, if an inclination of the via hole formed in the dielectric layer is steep, formation of an electrode in a wall surface and a bottom surface of the via hole will likely be incomplete, and thus, reliability decreases.

Some embodiments of the present invention provide a technique that is advantageous for achieving both improvement of characteristics and improvement of reliability of a semiconductor element.

According to some embodiments, a semiconductor element operable to generate or detect a terahertz wave, the semiconductor element comprising: a substrate; a first electrode; a semiconductor layer constituting, together with the first electrode, a mesa structure between a surface of the substrate and the first electrode and including a gain medium for a wavelength of a terahertz wave; a dielectric layer disposed so as to cover the substrate; and a second electrode disposed so as to cover the dielectric layer and connected to an upper surface of the first electrode via an opening provided in the dielectric layer, wherein a portion of the second electrode, the portion being disposed in the opening, includes a first inclined portion, a second inclined portion disposed between the first inclined portion and the first electrode and is smaller in inclination with respect to the surface of the substrate than the first inclined portion, and an intermediate portion connecting the first inclined portion and the second inclined portion, wherein the intermediate portion includes a planar terrace portion, and wherein the terrace portion is smaller in inclination with respect to the surface of the substrate than the first inclined portion and the second inclined portion, is provided.

Further features of the present invention will become apparent from the following description of exemplary embodiments (with reference to the attached drawings).

DESCRIPTION OF THE EMBODIMENTS

Figure 1A:
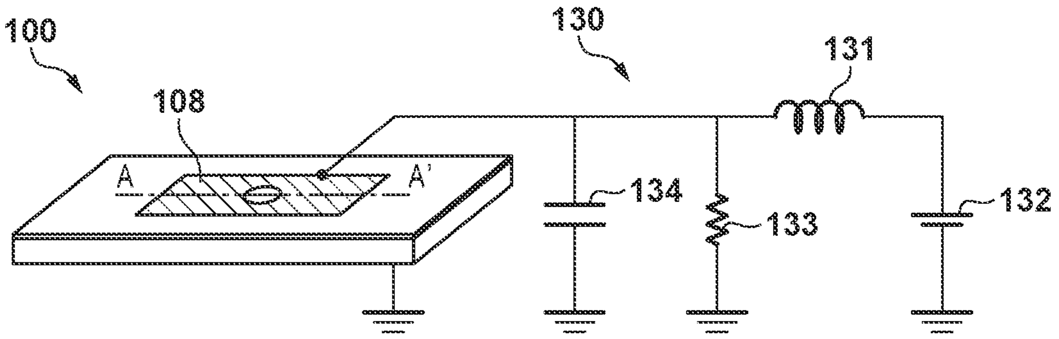
FIGS. 1A and 1B are diagrams illustrating an example of a configuration of a semiconductor element of the present embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1B:
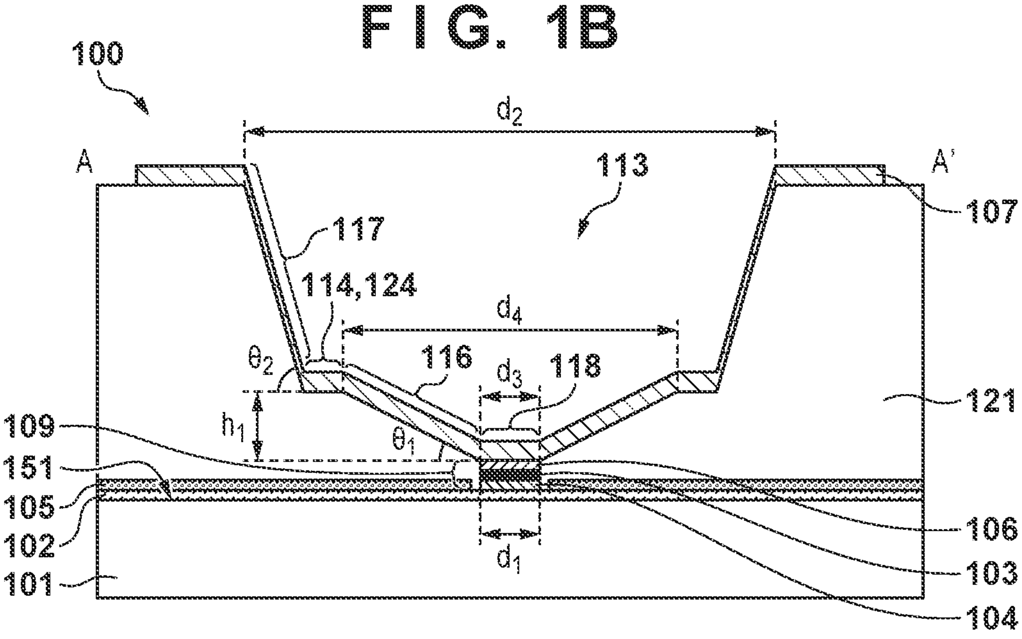

A semiconductor element according to an embodiment of the present disclosure will be described with reference to FIGS. 1A and 1B to FIG. 9. FIG. 1A is a perspective view illustrating an external view of a semiconductor element 100 of the present embodiment. FIG. 1B is a cross-sectional view illustrating an example of a configuration of the semiconductor element 100 across A-A' illustrated in FIG. 1A.

In the following description, an example in which the semiconductor element 100 is used as an oscillator for generating a terahertz wave will be described. However, the semiconductor element 100 can also be operated as a detector for detecting a terahertz wave using nonlinearity of current accompanying a voltage change in an active layer. Here, a terahertz wave may be defined as an electromagnetic wave having a frequency greater than or equal to 30 GHz and less than or equal to 30 THz. Therefore, a terahertz wave is an electromagnetic wave having a wavelength of about 10 μm to 10 mm.

In addition, in the following description, a length of each component in a direction of a normal of a surface 151 of a substrate 101 of the semiconductor element 100 may be expressed as "thickness" or "height". In addition, if a shape of a component disposed on the semiconductor element 100 is circular in a projection that is orthogonal to the surface 151 of the substrate 101, a length thereof may be expressed as a "diameter". In addition, a direction from the substrate 101 to a semiconductor layer 102 being stacked thereon is expressed as an "upper" side.

In the present embodiment, the semiconductor element 100 will be described using as an example a configuration in which a patch antenna 108, which is a microstrip resonator in which a resonant tunneling diode (RTD) 104 is sandwiched between the semiconductor layer 102 and an electrode 106. The semiconductor element 100 includes the substrate 101, the electrode 106, a semiconductor layer (a semiconductor layer 103 and the RTD 104), a dielectric layer 121 disposed so as to cover the substrate 101, an electrode 107, the semiconductor layer 102, and an electrode 105. The semiconductor layer (the semiconductor layer 103 and the RTD 104) form, together with the electrode 106, a mesa structure 109 between the substrate 101 and the electrode 106 and include a gain medium for a wavelength of a terahertz wave. The electrode 107 is disposed so as to cover the dielectric layer 121 and may be electrically connected to an upper surface of the electrode 106 via an opening 113 provided in the dielectric layer 121. The electrode 107 may constitute a patch conductor (antenna unit) of the patch antenna 108. In addition, a side of the RTD 104 opposite from the electrode 106 is electrically connected to the electrode 105 via the semiconductor layer 102. The electrode 105 may be grounded, for example.

In the present embodiment, the mesa structure 109 constituting of the RTD 104, the semiconductor layer 103, and the electrode 106 and the opening 113 are circular in a projection that is orthogonal to the surface 151 of the substrate 101. However, the present invention is not limited thereto, and the mesa structure 109 and the opening 113 may be, for example, rectangular or polygonal. A mesa structure is a structure in which a cross section of the structure is trapezoidal, rectangular, or the like in a cross-sectional view. In addition, although the square patch antenna 108 is used in the present embodiment, the shape of the resonator is not limited thereto. For example, the patch antenna 108 may use a patch conductor that is polygonal, such as rectangular or triangular; circular; elliptical; or the like.

The electrode 106 and the semiconductor layer 103 may be in Ohmic contact in order to reduce a loss due to series resistance. In order to bring the electrode 106 and the semiconductor layer 103 into Ohmic contact, materials, such as Au/Pd/Ti (/semiconductor layer 103), Au/Pt/Ti (/semiconductor layer 103), Au/Ni/Au/Ge (/semiconductor layer 103), TiW, Mo, and ErAs, may be used for the electrode 106. Here, Au/Pd/Ti may be a layered structure of Au, Pd, and Ti. The electrode 106 need only include at least one of these materials. In addition, in order to reduce contact resistance, the semiconductor layer 103 may be heavily doped with impurities. As a guide, by setting contact resistance between the electrode 106 and the semiconductor layer 103 to 1Ω or less, characteristics of the semiconductor element 100 as a terahertz wave oscillator may be improved. When using the semiconductor element 100 as a terahertz wave detector, a material of the electrode 106 may be selected such that the electrode 106 and the semiconductor layer 103 are in Schottky contact.

The RTD 104 is provided with a quantum well layer between a plurality of tunnel barriers and is an active layer for generating a terahertz wave by intersubband transition of carriers. A terahertz wave is generated by self-oscillation in a negative differential resistance region in this active layer. The RTD 104 may be formed together with the semiconductor layer 102 and the semiconductor layer 103 on the substrate 101 for which InP is used as a material, for example, by using a molecular beam epitaxy (MBE) method, a metalorganic vapor phase epitaxy (MOVPE) method, or the like. A quantum cascade structure having a multi-layered structure of several hundred to several thousand layers of semiconductors may be used as the active layer for generating a terahertz wave instead of the RTD 104. In addition, a negative resistance element, such as a Gunn diode or an IMPATT diode; a high frequency element, such as a transistor for which one terminal has been terminated; a heterojunction bipolar transistor; or a compound semiconductor-based FET or HEMT; may be used for terahertz wave oscillation.

The dielectric layer 121 is disposed between the electrode 105 and the electrode 107 and between the semiconductor layer 102 and the electrode 107 and surrounds a side surface of the mesa structure 109. An inorganic material, such as silicon oxide, silicon nitride, aluminum oxide, aluminum nitride, a TEOS oxide film, or spin-on-glass, for example, may be used for a material of the dielectric layer 121. In addition, for example, an organic material, such as benzocyclobutene (BCB), Teflon®, or polyimide, may be used for a material of the dielectric layer 121.

The opening 113 for exposing the upper surface of the electrode 106 is provided in the dielectric layer 121. The electrode 106 and the electrode 107 are electrically connected via the opening 113. In the following, a portion of the electrode 107 connected to the electrode 106 may be expressed as a connection portion 118. The connection portion 118 is a portion of the electrode 107 that is in contact with the electrode 106 and a portion disposed on that contact portion.

A portion of the electrode 107 that is disposed in the opening 113 includes an inclined portion 117, an inclined portion 116 disposed between the inclined portion 117 and the electrode 106 and is smaller in inclination with respect to the surface 151 of the substrate 101 than the inclined portion 117, and an intermediate portion 124 connecting the inclined portion 117 and the inclined portion 116. In the configuration illustrated in FIG. 1B, the inclined portion 116 is in contact with the connection portion 118. The intermediate portion 124 includes a planar terrace portion 114. The terrace portion 114 is smaller in inclination with respect to the surface 151 of the substrate 101 than the inclined portion 117 and the inclined portion 116. A face of the terrace portion 114 that is in contact with the dielectric layer 121 may be parallel to the surface 151 of the substrate 101. In addition, an inclination of a surface of the terrace portion 114 may be in a range of ±5° with respect to a virtual plane parallel to the surface 151 of the substrate 101. The terrace portion 114 can be said to be a horizontal portion between the inclined portion 117 and the inclined portion 116. In addition, a width of the terrace portion 114 between the inclined portion 117 and the inclined portion 116 may be, for example, larger than a thickness of the semiconductor layer (the RTD 104 and the semiconductor layer 103) constituting the mesa structure. That is, the terrace portion 114 can be said to have a predetermined width.

In FIG. 1B, a boundary between the inclined portion 117 and the intermediate portion 124 and a boundary between the intermediate portion 124 and the inclined portion 116 are depicted such that, for each, a flat surface and a flat surface are joined at their edges. Therefore, from the boundary with the inclined portion 117 to the boundary with the inclined portion 116, the terrace portion 114 includes the same region as that of the intermediate portion 124. However, an actual boundary between the inclined portion 117 and the intermediate portion 124 and an actual boundary between the intermediate portion 124 and the inclined portion 116 may be formed such that the angle continuously changes. Therefore, in the boundary between the inclined portion 117 and the intermediate portion 124, the boundary between the inclined portion 117 and the intermediate portion 124 may be defined, for example, by setting a portion for which an inclination with respect to the surface 151 of the substrate 101 is greater than 45° as the inclined portion 117. In addition, in the boundary between the intermediate portion 124 and the inclined portion 116, the boundary between the intermediate portion 124 and the inclined portion 116 may be defined, for example, by setting a portion for which an inclination with respect to the surface 151 of the substrate 101 is greater than or equal to 20° as the inclined portion 116. A planar portion of the intermediate portion 124 between boundaries thus defined is the terrace portion 114.

In addition, in the configuration illustrated in FIG. 1B, an example in which two inclined portions 116 and 117 are disposed is illustrated; however, the portion of the electrode 107 that is disposed in the opening 113 may include three or more inclined portions that are connected via intermediate portions that includes a terrace portion. In such a case, each inclined portion may be formed such that the closer the inclined portion is to the electrode 106, the smaller the inclination with respect to the surface 151 of the substrate 101. In the configuration illustrated in FIG. 1B, a relationship between an inclination $\theta_2$ of the inclined portion 117 with respect to the surface 151 of the substrate 101 and an inclination $\theta_1$ of the inclined portion 116 with respect to the surface 151 of the substrate 101 is $\theta_2>\theta_1$. In addition, for example, when an inclined portion connected to the inclined portion 117 via an intermediate portion that includes a terrace portion is present above the inclined portion 117, a relationship among an inclination $\theta_3$ of the inclined portion with respect to the surface 151 of the substrate 101 and the aforementioned $\theta_1$ and $\theta_2$ is $\theta_3>\theta_2>\theta_1$.

Here, in a projection that is orthogonal to the surface 151 of the substrate 101, a center of the mesa structure 109 and a center of the opening 113 may be disposed on the same axis. The respective "centers" of the mesa structure 109 and the opening 113 may be, for example, respective geometric center positions of the mesa structure 109 and the opening 113 in a projection that is orthogonal to the surface 151 of the substrate 101.

A bias circuit 130 may be connected to the semiconductor element 100. The bias circuit 130 is a circuit for supplying a bias voltage to the RTD 104. The bias circuit 130 includes a wire (inductance) 131, a power supply 132, a shunt resistor 133, and a capacitor 134. As illustrated in FIG. 1A, the shunt resistor 133 and the capacitor 134 are connected in parallel with the RTD 104. The power supply 132 provides current necessary for driving the RTD 104 and regulates a bias voltage selected from the negative differential resistance region of the RTD 104. The shunt resistor 133 and the capacitor 134 suppress parasitic oscillation of a relatively low resonant frequency (typically, a frequency band for direct current) caused by the bias circuit. Regarding a resistance value of the shunt resistor 133, a value equal to an absolute value of a negative differential resistance of the RTD 104 or slightly less than the absolute value of the negative differential resistance of the RTD 104 is selected. The capacitor 134 is set to be equal to or slightly lower than the absolute value of the negative differential resistance of the RTD 104 and an impedance of the semiconductor element 100. In the present embodiment, a capacitor that is approximately several tens of pF is used as the capacitor 134.

Figure 2A:
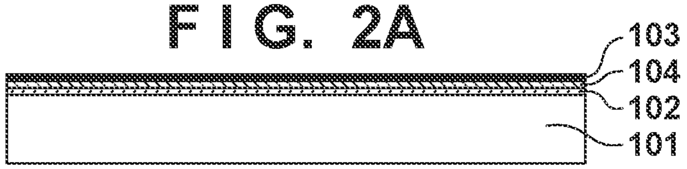
FIGS. 2A to 2G are diagram illustrating a process flow of the semiconductor element of FIG. 1B.
Figure 2B:
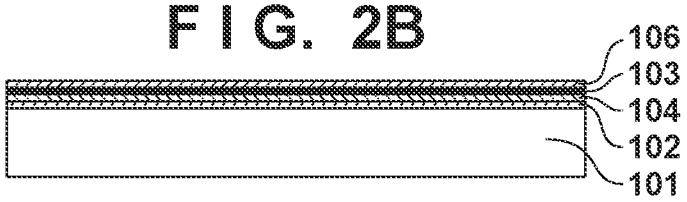
Figure 2C:
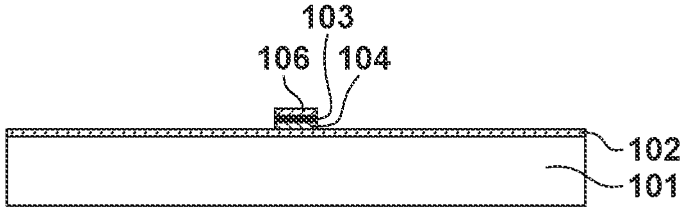
Figure 2D:
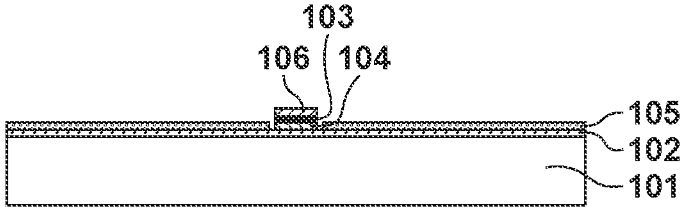

Next, a method of manufacturing the semiconductor element 100 will be described with reference to a process flow illustrated in FIGS. 2A to 2G. First, as illustrated in FIG. 2A, the semiconductor layer 102, the RTD 104, and the semiconductor layer 103 are formed on the substrate 101 by using the MBE method, the MOVPE method, or the like. Next, as illustrated in FIG. 2B, the electrode 106 (Au/Pd/Ti), which is an Ohmic electrode, is formed by depositing 20 nm of Ti, 20 nm of Pd, and 200 nm of Au on the semiconductor layer 103. After formation of the electrode 106, the mesa structure 109 configured to include the RTD 104, the semiconductor layer 103, and the electrode 106 is formed through a photolithographic process and an etching process as illustrated in FIG. 2C. A diameter of the mesa structure 109 is, for example, approximately 0.1 to 5.0 μm. After formation of the mesa structure 109, the electrode 105 having a layered structure of Au (200 nm)/Pd (20 nm)/Ti (20 nm) is formed on the semiconductor layer 102, for example, by using a lift-off method or the like, as illustrated in FIG. 2D. Ti of the electrode 105 may be in contact with the semiconductor layer 102.

Figure 2E:
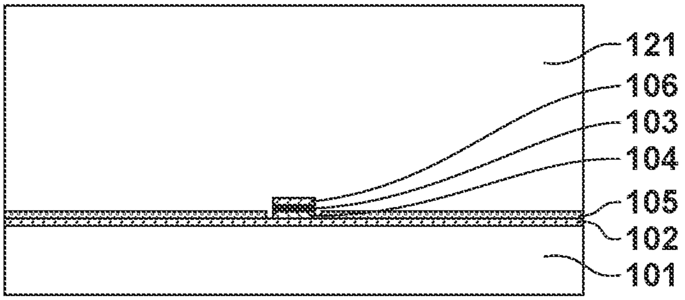
Figure 2F:
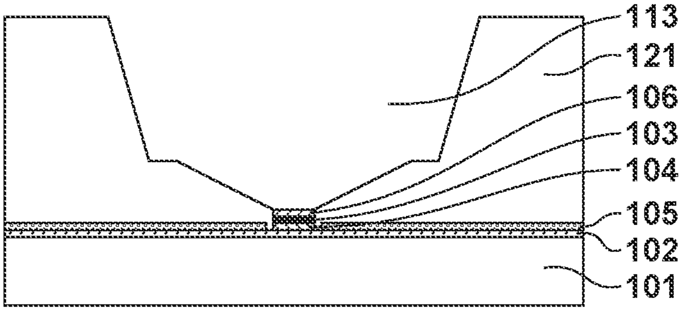

Next, as illustrated in FIG. 2E, the dielectric layer 121 is formed using a plasma CVD method, a spin coat method, or the like. After formation of the dielectric layer 121, the opening 113 is formed in the dielectric layer 121 so as to expose the upper surface of the electrode 106, through a photolithographic process and an etching process, as illustrated in FIG. 2F. The opening 113 may be formed, for example, by using two stages of the photolithographic process and the etching process. First, a portion to be a base for the aforementioned inclined portion 117 and intermediate portion 124 of the electrode 107 is formed by the first stage of the photolithography process and the etching process. Next, a portion to be a base for the inclined portion 116 of the electrode 107 is formed by the second stage of the photolithographic process and the etching process, and thus, the electrode 106 becomes exposed. However, the present invention is not limited thereto. The opening 113 illustrated in FIG. 2F may be formed by single photolithographic process and etching process, such as adjusting a shape of an etching mask and a shape of the dielectric layer 121 or changing etching conditions during etching. An inclination angle and a shape of a wall surface of the opening 113 of the dielectric layer 121 can be arbitrarily controlled by controlling etching conditions, a shape of an etching mask, a material of the dielectric layer 121 and a composition thereof, and the like.

Figure 2G:
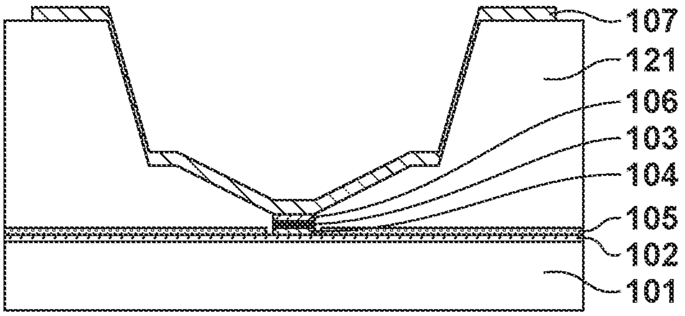

After formation of the opening 113, 20 nm of Ti and 200 nm of Au are deposited as illustrated in FIG. 2G. After formation of Au and Ti, the electrode 107 is formed by a photolithography process and an etching process, and thus, the semiconductor element 100 is manufactured. The semiconductor element 100 may be connected to the bias circuit 130 as described above and used.

A more detailed configuration of the semiconductor element 100 for generating a terahertz wave will be described with reference to FIG. 1B again. Regarding the semiconductor element 100, the dielectric layer 121 needs to be thickened in order to obtain desired characteristics. Since the dielectric layer 121 is thick, if an inclination angle of the opening 113 is gentle, an opening diameter $d_2$ of the opening 113 will increase and interfere with a resonant electric field, and thus, radiation efficiency (reception efficiency) of a terahertz wave decreases. Therefore, the opening diameter $d_2$ of the opening 113, which is on a side farther from the substrate 101 needs to be a size that does interfere with a resonant electric field in view of radiation efficiency. For example, the opening diameter $d_2$ may be less than or equal to 1/10 of an effective wavelength of a terahertz wave at resonance in the resonator that is in the dielectric layer 121. Conversely, when the inclination angle of the opening 113 is steep, an aspect ratio of the opening 113 increases, and it becomes difficult for the electrode 107 to be formed on the side surface of the opening 113 and a bottom of the opening 113. When formation of the electrode 107 is incomplete, reliability of the semiconductor element 100 may decrease.

To solve the above-described two problems, regarding the opening 113, a structure needs to be such that an opening on a side away from the substrate 101 of the opening 113 is not too wide and a portion closer to the substrate 101 is wide. In summary, it is necessary that the following conditions be met. As described above, the relationship of the inclination $\theta_1$ of the inclined portion 116 and the inclination $\theta_2$ of the inclined portion 117 of the electrode 107 formed on the dielectric layer 121 is $\theta_1<\theta_2$. Considering a case where the electrode 107 is formed using a sputtering method, the inclination of the inclined portion 116 with respect to the surface 151 of the substrate 101 may be 45° or less.

Here, the inclination of the inclined portion 116, 117 with respect to the surface 151 of the substrate 101 can be obtained from a difference between a diameter of the inclined portion 116, 117 on a side closer to the substrate 101 and a diameter of the inclined portion 116, 117 on a side farther from the substrate 101 in a direction that is parallel to the surface 151 of the substrate 101 and a height of the inclined portion 116, 117 in a direction of the normal of the surface 151 of the substrate 101. For example, the inclination $\theta_1$ of the inclined portion 116 with respect to the surface 151 of the substrate 101 is obtained by the following Equation (1).

$$\tan\theta_1=(d_4-d_3)/2h_1 \quad (1)$$

$d_3$: Diameter of the inclined portion 116 on the side closer to the substrate 101

$d_4$: Diameter of the inclined portion 116 on the side farther from the substrate 101

$h_1$: Height of the inclined portion 116 in a direction of the normal of the surface 151 of the substrate 101

An opening diameter (in the configuration illustrated in FIG. 1B, equal to the diameter $d_3$ of the inclined portion 116 on the side closer to the substrate 101) of the opening 113 for exposing the upper surface of the electrode 106 is less than or equal to a diameter $d_1$ of the mesa structure 109. That is, a configuration that satisfies the following Equation (2) is assumed.

$$d_3\leq d_1 \quad (2)$$

Although $d_3=d_1$ in the configuration illustrated in FIG. 1B, the present invention is not limited thereto, and the diameter $d_3$ may be smaller than the diameter $d_1$ as will be described later.

BCB (manufactured by Dow Chemical Co.; relative dielectric constant $\varepsilon_r=2$) having a thickness of 7 μm may be used as the dielectric layer 121. The mesa structure 109 is configured to include the RTD 104, the semiconductor layer 103, and the electrode 106 from the substrate 101 side and may be formed as a circular mesa structure. A size of the mesa structure 109 is, for example, 1.0 μm in diameter $d_1$ and 0.3 μm in height. The RTD 104 may be a double-barrier structure constituting of a multi-quantum well structure by lattice-matched InGaAs/AlAs. The electrodes 105 and 106 may be, for example, an Au/Pd/Ti layered structure as described above. The semiconductor layers 102 and 103 may be InGaAs layers (e.g., 100 nm) for which an electron concentration is greater than or equal to $1\times10^{18}$ cm$^{-3}$. In addition, the electrode 105 and the semiconductor layer 102 and the electrode 106 and the semiconductor layer 103 may be connected by a low-resistance Ohmic contact. The electrode 107 may be an Au/Ti layered structure as described above.

In the opening 113, the electrode 107 is formed on walls of the dielectric layer 121 having different inclination angles from each other. Therefore, as illustrated in FIG. 1B, a film thickness of the inclined portion 116, which is formed on a portion having a gentle inclination angle may be thicker than a film thickness of the inclined portion 117, which is formed on a portion having a steep inclination angle. Here, the film thickness of the inclined portion 116 is a film thickness in a direction of the normal of a surface of the inclined portion 116. Similarly, the film thickness of the inclined portion 117 is a film thickness in a direction of the normal of a surface of the inclined portion 117. The film thickness of the inclined portion 116 can be said to be a distance from the side surface of the opening 113—that is, a surface of the dielectric layer 121—to a surface of the inclined portion 116 in the aforementioned direction of the normal. The film thickness of the inclined portion 117 can be said to be a distance from the side surface of the opening 113—that is, a surface of the dielectric layer 121—to a surface of the inclined portion 117 in the aforementioned direction of the normal. In addition, although it has been described with reference to FIG. 2G that, in formation of the electrode 107, 20 nm of Ti and 200 nm of Au are deposited, these film thicknesses are film thicknesses for when they are formed on a flat location parallel to the surface 151 of the substrate 101, such as outside of the opening 113.

In addition, as illustrated in FIG. 1B, the inclined portion 116 may be disposed farther on the substrate 101 side than half of a height of the opening 113. In addition, the inclined portion 117 may include a portion disposed farther on the substrate 101 side than half of the height of the opening 113 and a portion disposed further away from the substrate 101 side than half of the height of the opening 113. By these configurations, a decrease in coverage of the electrode 107 of the opening 113 on the side closer to the substrate 101 is suppressed while reducing the opening diameter $d_2$ of the opening 113. As illustrated in FIGS. 2E and 2F, the height of the opening 113 is a height in the direction of the normal of the surface 151, with the upper surface of the electrode 106 as a reference. For example, an upper end of the opening 113 may constitute the same face as the upper surface of the dielectric layer 121 and a lower end of the opening 113 may form the same face as the upper surface of the electrode 106. The upper surface of the electrode 106 may be, for example, a starting point of the height $h_1$ of FIG. 1B.

As described above, the opening 113, for connecting the RTD 104 to an external power source (e.g., the bias circuit 130), provided in the dielectric layer 121 of the semiconductor element 100 includes wall surfaces having different inclination angles. An inclination is more gentle on a side of the opening 113 closer to the substrate 101 than on a side farther from the substrate. This reduces the opening diameter $d_2$ of the opening 113, and thus, a decrease in radiation efficiency (reception efficiency) of a terahertz wave due to interference with a resonant electric field is suppressed. In addition, coverage of the electrode 107 on the side of the opening 113 closer to the substrate 101 improves, and thus, a decrease in reliability of the semiconductor element 100 can be suppressed. That is, it is possible to achieve both improvement of characteristics and improvement of reliability of the semiconductor element 100. In FIG. 1B, there may be cases where the side surface of the opening 113 and the surface of the inclined portion 116 are not parallel. In addition, there may be cases where the side surface of the opening 113 and the surface of the inclined portion 117 are not parallel. Even in such cases, it is possible to achieve both improvement of characteristics and improvement of reliability of the semiconductor element 100.

A variation of the above-described semiconductor element 100 will be described below with reference to FIGS. 3 to 9. A semiconductor element 200 illustrated in FIG. 3 includes a plurality of terrace portions in the portion of the electrode 107 that is disposed in the opening 113. Other components may be similar to those of the above-described semiconductor element 100, and so, points of difference will mainly be described.

Figure 3:
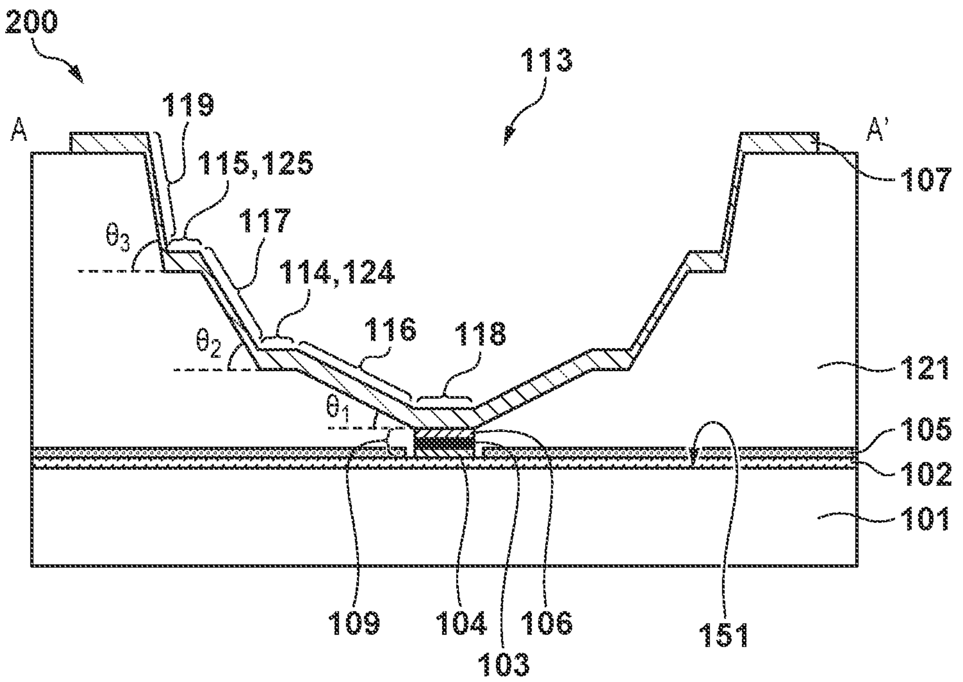
FIG. 3 is a diagram illustrating a variation of the semiconductor element of FIG. 1B.

In the configuration illustrated in FIG. 3, the portion of the electrode 107 that is disposed in the opening 113 further includes an inclined portion 119 and an intermediate portion 125. The inclined portion 119 is disposed farther on an upper end side of the opening 113 than the inclined portion 117 and is larger in inclination with respect to the surface 151 of the substrate 101 than the inclined portion 117. The intermediate portion 125 connects the inclined portion 117 and the inclined portion 119. Here, the intermediate portion 125 may include a planar terrace portion 115. The terrace portion 115 is smaller in inclination with respect to the surface 151 of the substrate 101 than the inclined portions 116, 117, and 119. A face of the terrace portion 115 that is in contact with the dielectric layer 121 may be parallel to the surface 151 of the substrate 101. In addition, an inclination of the surface of the terrace portion 115 may be in a range of ±5° with respect to a virtual plane parallel to the surface 151 of the substrate 101. The terrace portion 115 can be said to be a horizontal portion between the inclined portion 117 and the inclined portion 119. In addition, a width of the terrace portion 115 between the inclined portion 117 and the inclined portion 119 may be, for example, larger than a thickness of the semiconductor layer (the RTD 104 and the semiconductor layer 103) constituting the mesa structure. That is, the terrace portion 115 can be said to have a predetermined width. The terrace portion 115 may be smaller in width than the terrace portion 114.

In FIG. 3, a boundary between the inclined portion 117 and the intermediate portion 125 and a boundary between the intermediate portion 125 and the inclined portion 119 are depicted such that, for each, a flat surface and a flat surface are joined at their edges. Therefore, from the boundary with the inclined portion 117 to the boundary with the inclined portion 119, the terrace portion 115 includes the same region as that of the intermediate portion 125. However, an actual boundary between the inclined portion 117 and the intermediate portion 125 and an actual boundary between the intermediate portion 125 and the inclined portion 119 may be formed such that the angle continuously changes. Therefore, similarly to the description above, in the boundary between the inclined portion 117 and the intermediate portion 125, the boundary between the inclined portion 117 and the intermediate portion 125 may be defined, for example, by setting a portion for which an inclination with respect to the surface 151 of the substrate 101 is greater than 45° as the inclined portion 117. In addition, in the boundary between the intermediate portion 125 and the inclined portion 119, the boundary between the intermediate portion 125 and the inclined portion 119 may be defined, for example, by setting a portion for which an inclination with respect to the surface 151 of the substrate 101 is greater than 45° as the inclined portion 119. A planar portion of the intermediate portion 125 between boundaries thus defined may be the terrace portion 115.

A flexible configuration of the opening 113 is necessary depending on the thickness of the dielectric layer 121 and the thickness of the electrode 107: for example, there are cases where the thickness of the dielectric layer 121 will be thicker than what has been prescribed and the thickness of the electrode 107 will be thinner than what has been prescribed. To do this, the number of terrace portions disposed in the opening 113 is increased. This makes it possible to increase a degree of freedom in the design of angles of a wall surface and widths of terrace surfaces of the opening 113 provided in the dielectric layer 121. In the configuration illustrated in FIG. 3, a configuration in which, in the portion of the electrode 107 that is disposed in the opening 113, three inclined portions 116, 117, and 119 and two intermediate portions 124 and 125 that connect the respective inclined portions 116, 117, and 119 are disposed is described. The portion of the electrode 107 that is disposed in the opening 113 may be configured to have three or more intermediate portions 124 and 125 that include terrace portions 114 and 115. Appropriate design may be taken according to the thickness of the dielectric layer 121, the thickness of the electrode 107, and the like.

In the configuration illustrated in FIG. 3, a relationship among the inclination $\theta_1$ of the inclined portion 116 with respect to the surface 151 of the substrate 101, the inclination $\theta_2$ of the inclined portion 117 with respect to the surface 151 of the substrate 101, and an inclination $\theta_3$ of the inclined portion 119 with respect to the surface 151 of the substrate 101 is $\theta_1<\theta_2<\theta_3$. That is, as described above, the closer the inclined portion is to the electrode 106, the smaller the inclination with respect to the surface 151 of the substrate 101.

Figure 4:
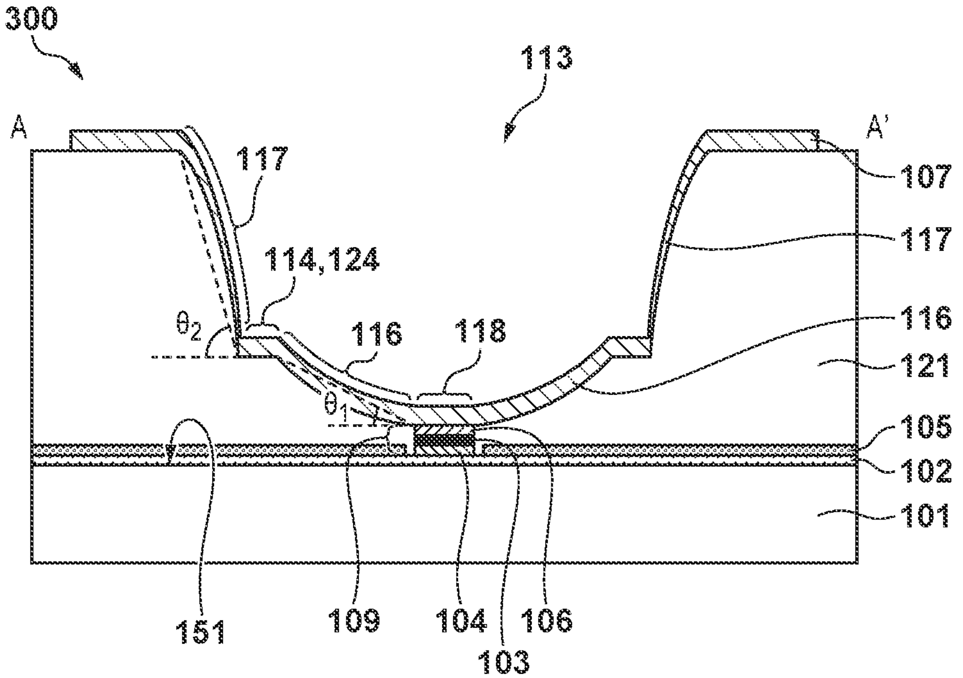
FIG. 4 is a diagram illustrating a variation of the semiconductor element of FIG. 1B.
Figure 5A:
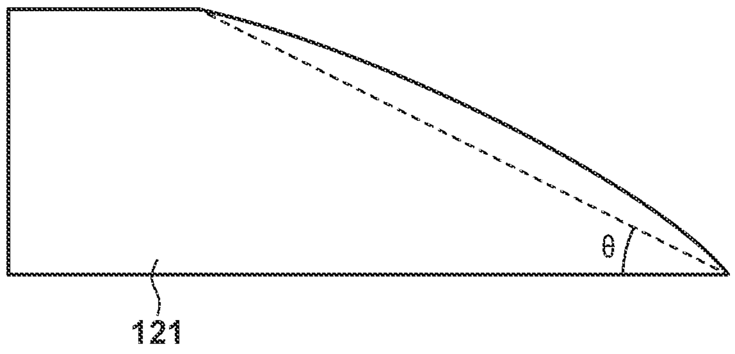
FIGS. 5A and 5B are diagrams for explaining shapes of an opening of the semiconductor element of FIG. 4.
Figure 5B:
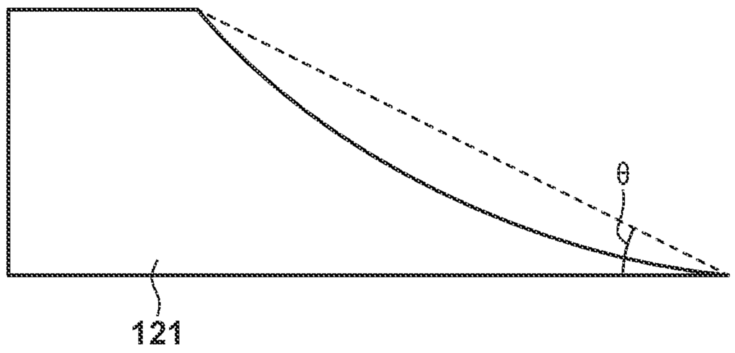

FIG. 4 and FIGS. 5A and 5B are diagrams for explaining a semiconductor element 300, which is a variation of the semiconductor element 100. The surfaces of the inclined portions 116 and 117 of the above-described semiconductor element 100 are flat surfaces. However, the surfaces of the inclined portions 116 and 117 of the electrode 107 that are disposed in the opening 113 are not limited to flat surfaces. As illustrated in FIG. 4, the faces of the inclined portions 116 and 117 of the electrode 107 that are disposed in the opening 113 may be surfaces that continuously change in inclination. Shape of the surfaces of the inclined portions 116 and 117 of the electrode 107 can be controlled by shapes of wall surfaces of the opening 113 provided in the dielectric layer 121.

As illustrated in FIGS. 4 and 5A, the inclined portion 117 and a wall surface of the dielectric layer 121 that serves as a base for the inclined portion 117 may have a curvature that is convex in a direction inwardly to the opening 113. A configuration that is convex in the direction inwardly to the opening 113 has an effect of suppressing a decrease in radiation efficiency (reception efficiency) of a terahertz wave. Meanwhile, as illustrated in FIGS. 4 and 5B, the inclined portion 116 and a wall surface that serves as a base for the inclined portion 116 may have a curvature that is concave in a direction inward to the opening 113. By the dielectric layer 121 having a concave curvature, it becomes easier for the electrode 107 to be formed on the concave dielectric layer 121 to be deposited uniformly. As a result, there is the effect of suppressing a decrease in reliability of the semiconductor element 300.

In FIGS. 5A and 5B, wall surfaces of the opening 113 provided in the dielectric layer 121, each having a uniform curvature, are illustrated; however, they may result from a combination of a plurality of curves. In the configuration illustrated in FIG. 4, the dielectric layer 121 that serves as a base of the inclined portion 116 has a shape illustrated in FIG. 5B, and the dielectric layer 121 that serves as a base of the inclined portion 117 has a shape illustrated in FIG. 5A; however, the present invention is not limited to a combination thereof. In addition, even when the inclinations of the inclined portion 116 and 117 change, inclinations θ of the inclined portions 116 and 117 with respect to the surface 151 of the substrate 101 are defined as illustrated in FIGS. 5A and 5B, similarly to the description above.

Figure 6:
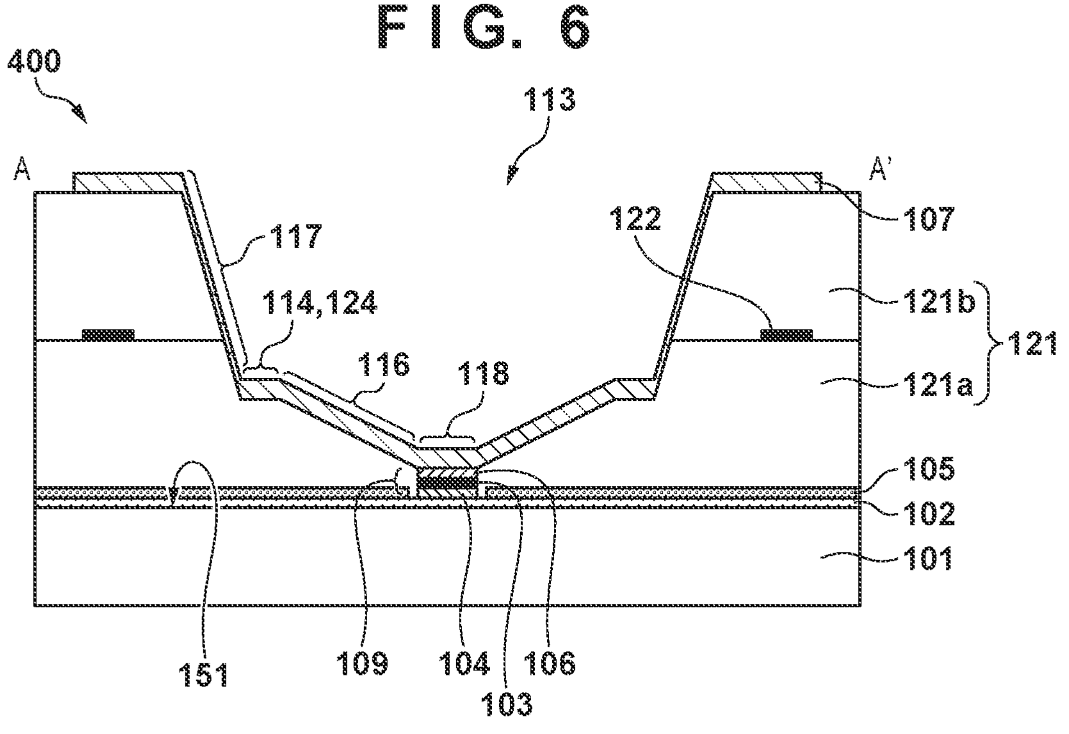
FIG. 6 is a diagram illustrating a variation of the semiconductor element of FIG. 1B.

FIG. 6 is a diagram for explaining a semiconductor element 400, which is a variation of the semiconductor element 100. As illustrated in FIG. 6, the dielectric layer 121 of the semiconductor element 400 may constitute of a plurality of layers. In the configuration illustrated in FIG. 6, the dielectric layer 121 includes two layers: a dielectric layer 121*a* and a dielectric layer 121*b*.

Components, such as resistors and a wiring pattern, are necessary for operating the semiconductor element 400. These components may be disposed on the dielectric layer 121, for example. However, depending on the material or the like of the dielectric layer 121, characteristics of the components may decrease or stability of a process may decrease due to the components being disposed. In addition, it is conceivable that, when all of these components are disposed on the dielectric layer 121, the semiconductor element 400 increases in size.

With respect to this, there is a possibility that the above-described problems can be solved by forming the dielectric layer 121 in a plurality of instances. For example, after deposition of the dielectric layer 121*a*, components 122, such as resistors and a wiring pattern, are formed. If undulation of a surface of the dielectric layer 121*a* after deposition of the dielectric layer 121*a* is large, a planarization process may be added. By the surface of the dielectric layer 121*a* being planar, formation of the components 122 becomes easier, and thus, variation or the like in characteristics of the components 122 is suppressed. After formation of the components 122, the dielectric layer 121*b* is deposited, and thus, the dielectric layer 121 is formed.

In the configuration illustrated in FIG. 6, the dielectric layer 121 is two layers, the dielectric layer 121*a* and the dielectric layer 121*b*; however, the present invention is not limited thereto, and the dielectric layer 121 may constitute of three or more layers. In addition, although a height at which the components 122 are disposed and a height at which the terrace portion 114 of the electrode 107 is disposed are different from each other, they may be the same height.

Figure 7:
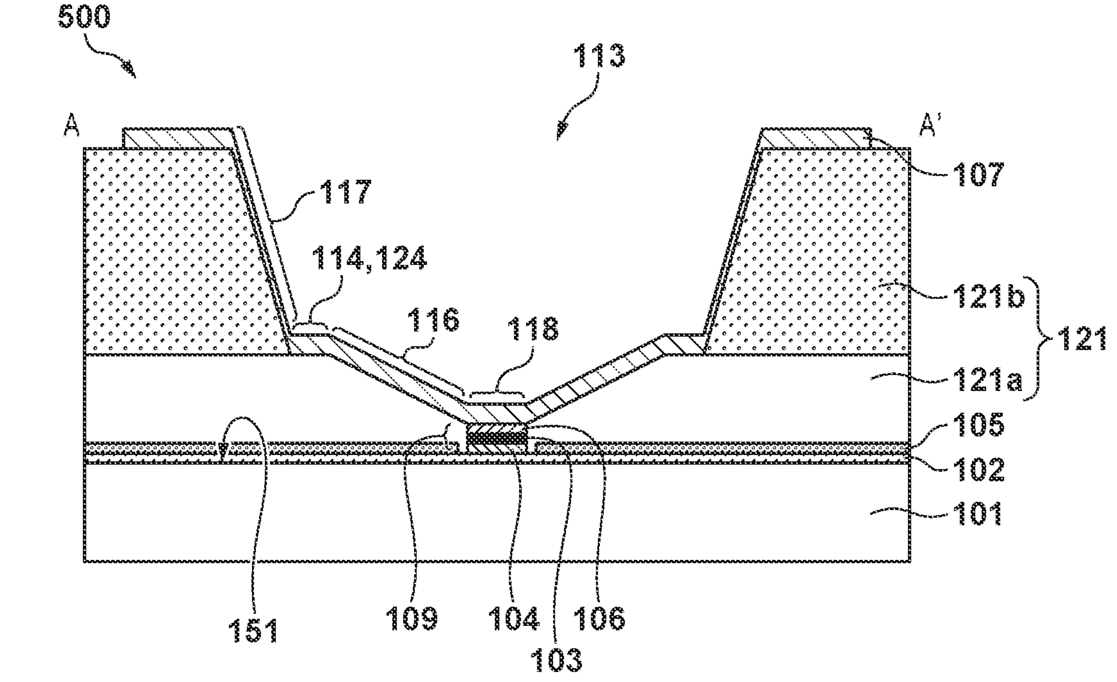
FIG. 7 is a diagram illustrating a variation of the semiconductor element of FIG. 1B.
Figure 8:
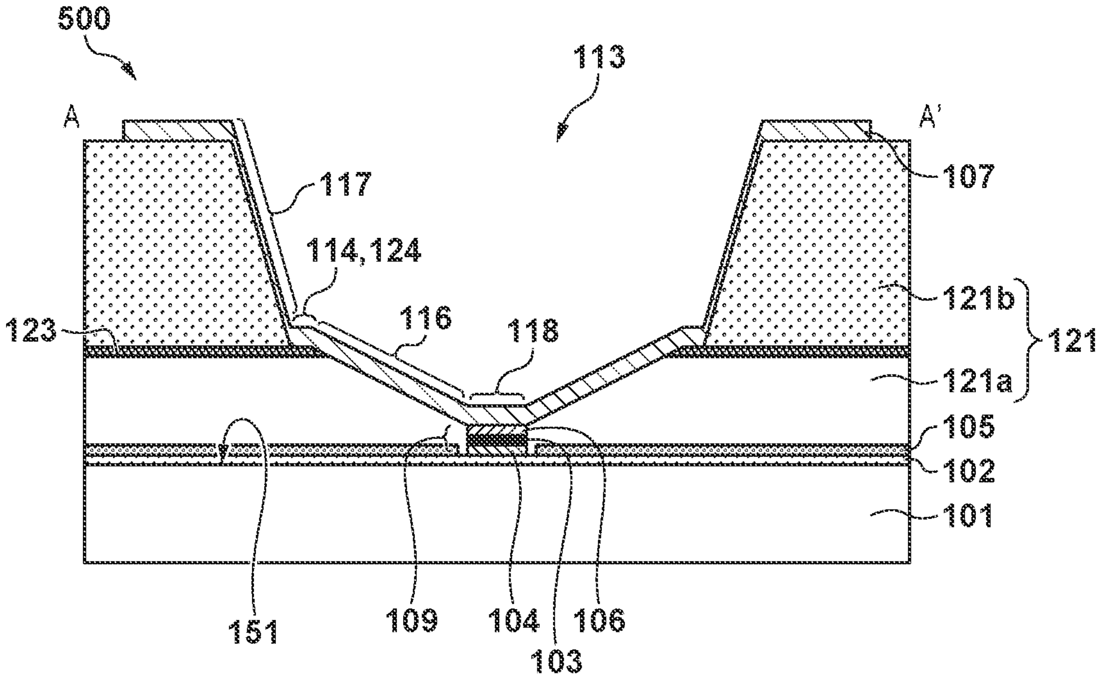
FIG. 8 is a diagram illustrating a variation of the semiconductor element of FIG. 1B.

FIGS. 7 and 8 are diagrams for explaining a semiconductor element 500, which is a variation of the semiconductor element 100. In the configuration illustrated in FIG. 7, the dielectric layer 121 constitutes of a plurality of layers that include the dielectric layer 121*a* and the dielectric layer 121*b*, similarly to the configuration illustrated in FIG. 6. In this case, the plurality of layers included in the dielectric layer 121 may include layers constituting of different materials from each other.

In the semiconductor element 500, the dielectric layer 121 may need to be thickened in order to obtain desired characteristics. However, it may be difficult to form a desired shape of the opening 113 for the thick dielectric layer 121 depending on the configuration of the semiconductor element 500 or conditions of a process. With respect to this, by making materials of the plurality of layers constituting the dielectric layer 121 different from each other, the opening 113 of a desired shape may easily be formed. As a specific effect, due to a difference in etching rate between the dielectric layer 121*a* and the dielectric layer 121*b*, it is possible to easily control an angle between a portion to be a base of the inclined portion 116 of the dielectric layer 121 and a portion to be a base of the inclined portion 117 of the dielectric layer 121.

For example, when the opening 113 is formed in single photolithography process and etching process, the process may be complicated, such as adjusting a shape of an etching mask and a shape of the dielectric layer 121 or changing etching conditions or the like during etching. Meanwhile, when there is a difference in etching rate between the dielectric layer 121*a* and the dielectric layer 121*b*, it may be possible to improve stability of the process while suppressing the process from becoming complicated.

In addition, a material having a smaller etching rate with respect to etching conditions of the dielectric layer 121*b* is selected as a material of the dielectric layer 121*a*. That is, a material that increases an etching selectivity between the dielectric layer 121*a* and the dielectric layer 121*b* is selected. This makes it possible to, when the dielectric layer 121*a* disposed at a boundary between the dielectric layer 121*a* and the dielectric layer 121*b* is to be made a base for the terrace portion 114 of the electrode 107, easily control a height from the substrate 101 to the terrace portion 114.

In the above-described arrangement, after deposition of the dielectric layer 121*a* and the dielectric layer 121*b*, a portion of the opening 113 that is disposed in the dielectric layer 121*b* may be opened, and then a portion of the opening 113 that is disposed in the dielectric layer 121*a* may be opened. Further, for example, the following process may be used. First, the dielectric layer 121*a* is deposited, and then a portion of the opening 113 that is to be disposed in the dielectric layer 121*a* is opened. Next, the dielectric layer 121*b* is deposited. After deposition of the dielectric layer 121*b*, a portion of the opening 113 that is to be disposed in the dielectric layer 121*b* and the dielectric layer 121*b* deposited into the opening provided in the dielectric layer 121*a* may be etched. If the etching selectivity of the dielectric layer 121*a* to the dielectric layer 121*b* is high, a process such as the latter is also possible. In the latter process, a film thickness of a mask pattern during etching of the dielectric layer 121*a* for exposing the electrode 106 is thinner than that of the former process. Therefore, it has an advantage that alignment is more accurate.

In addition, as illustrated in FIG. 8, an etch-stop (ES) layer 123, which constitutes of a material having a low etch rate with respect to the etching conditions of the dielectric layer 121*b*, may be disposed between the dielectric layer 121*a* and the dielectric layer 121*b*. The ES layer 123 need only be of a material that is smaller in etching rate with respect to the etching conditions of the dielectric layer 121*b* and thus may be a dielectric or, for example, may be of a metallic material. In addition, in the configuration illustrated in FIG. 8, the ES layer 123 is formed over the entire surface of the substrate 101 but may be formed only at a portion corresponding to a position at which the terrace portion 114 of the electrode 107 is to be disposed.

Since an insulation property and submicron-order processing accuracy is necessary for a material of the dielectric layer 121*a*, inorganic materials, such as silicon oxide, silicon nitride, aluminum oxide, and aluminum nitride, may be used. Aside from an organic material, such as BCB, Teflon, or polyimide, an inorganic material, such as TEOS oxide film or spin-on-glass, may be used as a material of the dielectric layer 121*b*. The dielectric layer 121*b* may necessitate formation of a thick film that is 3 μm or more, and so, a material that is low in terahertz wave loss and has a low dielectric constant and good workability is necessary. However, for mode control, a thickness $t_1$ of the dielectric layer 121*b* may satisfy the following Equation (3).

$$t_1=\lambda_0/(10\times\sqrt{\varepsilon_{r2}}) \quad (3)$$

$\lambda_0$: wavelength of a terahertz wave in a vacuum $\varepsilon_{r2}$: relative dielectric constant of the dielectric layer 121*b*

In addition, the smaller the difference in dielectric constant between the antenna and the air, the more the impedance matches, and so, $\varepsilon_{r2}<\varepsilon_{r1}$ may be satisfied. Here, $\varepsilon_{r1}$ is a relative dielectric constant of the dielectric layer 121*a*. In the above configuration, for example, the plurality of layers constituting the dielectric layer 121 may include, as the dielectric layer 121*b*, a layer of an organic material, such as BCB, that contacts the inclined portion 117 and, as the dielectric layer 121*a*, a layer of an inorganic material, such as silicon oxide or silicon nitride, that contacts the inclined portion 116.

Figure 9:
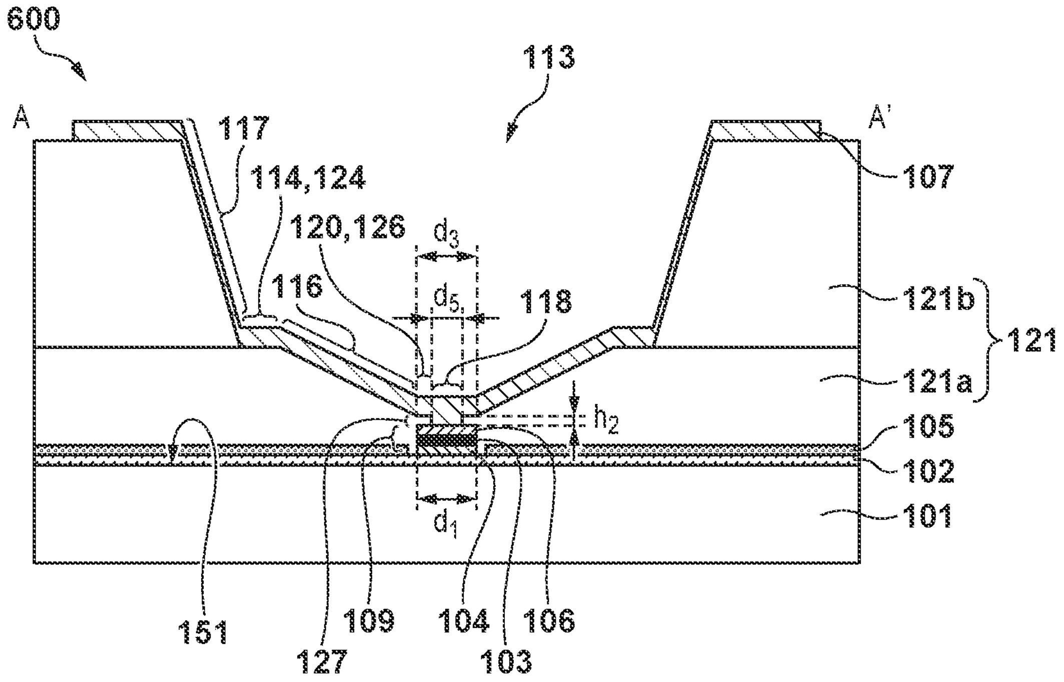
FIG. 9 is a diagram illustrating a variation of the semiconductor element of FIG. 1B.

FIG. 9 is a diagram for explaining a semiconductor element 600, which is a variation of the semiconductor element 100. As described above, the portion of the electrode 107 that is disposed in the opening 113 includes a connection portion 118, which is connected to the electrode 106. As illustrated in FIG. 9, the opening 113 may include a via portion 127, in which the connection portion 118 is embedded, for connecting the connection portion 118 and the electrode 106. The connection portion 118 may be referred to as a contact plug, a via plug, or the like and the via portion 127 can be said to include a contact hole or a via hole.

In the configuration illustrated in FIGS. 7 and 8, a structure in which the electrode 107 is electrically connected to the electrode 106 is made by setting a bottom surface of the opening 113 to be at the same height as the upper surface of the electrode 106. In such a case, it is necessary to satisfy the Equation (2) as described above; however, since a portion that serves as a base for the inclined portion 116 of the dielectric layer 121 has a tapered structure, if the dielectric layer 121*a* is thick, for example, it becomes difficult, in the process, to satisfy the Equation (2) while exposing the top layer of the electrode 106.

With respect to this, a configuration is taken such that the via portion 127 is provided on the bottom surface of the opening 113 and the connection portion 118 of the electrode 107 and the electrode 106 are connected via the via portion 127. That makes it possible to connect the electrode 106 and the electrode 107 with a good yield rate. In such a case, the upper surface of the electrode 106 and the connection portion 118 of the electrode 107 need only be connected, and so, it is not absolutely necessary to satisfy the Equation (2). When providing the via portion 127, a diameter $d_5$ of the via portion 127 and the diameter $d_1$ of the mesa structure 109 need only satisfy a relationship in which $d_5 \leq d_1$. In addition, in order to improve a yield of connection between the electrode 106 and the electrode 107, when a height of the via portion 127 in the direction of the normal of the surface 151 of the substrate 101 is $h_2$, a relationship in which $h_2<d_5$ may be satisfied. That is, a width (diameter $d_5$) of the via portion 127 in a direction parallel to the surface 151 of the substrate 101 may be larger than the height $h_2$ of the via portion 127 in a direction that intersects with the surface 151 of the substrate 101.

Regarding a sidewall of the via portion 127, inclination with respect to the surface 151 of the substrate 101 may be, for example, 70° or more. For example, the sidewall of the via portion 127 may have an angle, such as 75° or 80°, with respect to the surface 151 of the substrate 101. In addition, for example, the sidewall of the via portion 127 may be substantially perpendicular to the surface 151 of the substrate 101. In addition, the via portion 127 of the opening 113 may be completely embedded by the connection portion 118 or there may be space to an extent that does not impair conductivity according to the connection portion 118. The sidewall of the via portion 127 may be a so-called side surface of the dielectric layer 121.

In addition, as illustrated in FIG. 9, the portion of the electrode 107 that is disposed in the opening 113 may include an intermediate portion 126 that connects the inclined portion 116 and the connection portion 118. As described above, the connection portion 118 is a portion of the electrode 107 that is in contact with the electrode 106 and a portion disposed on that contact portion. The intermediate portion 126 may include a planar terrace portion 120. The terrace portion 120 is a portion that is smaller in inclination with respect to the surface 151 of the substrate 101 than the inclined portions 116 and 117. A face of the terrace portion 120 that is in contact with the dielectric layer 121 may be parallel to the surface 151 of the substrate 101. In addition, an inclination of the surface of the terrace portion 120 may be in a range of ±5° with respect to a virtual plane parallel to the surface 151 of the substrate 101. The terrace portion 120 can be said to be a horizontal portion between the inclined portion 116 and the connection portion 118. In addition, a width of the terrace portion 120 between the inclined portion 116 and the connection portion 118 may be, for example, larger than a thickness of the semiconductor layer (the RTD 104 and the semiconductor layer 103) constituting the mesa structure. That is, the terrace portion 120 can be said to have a predetermined width.

In FIG. 9, a boundary between the inclined portion 116 and the intermediate portion 126 is depicted such that a flat surface and a flat surface are joined at their edges. Therefore, until the boundary with the inclined portion 116, the terrace portion 114 includes the same region as that of the intermediate portion 126. However, an actual boundary between the inclined portion 116 and the intermediate portion 126 may be formed such that the angle continuously changes. Therefore, in the boundary between the inclined portion 116 and the intermediate portion 126, the boundary between the inclined portion 116 and the intermediate portion 126 may be defined, for example, by setting a portion for which an inclination with respect to the surface 151 of the substrate 101 is greater than or equal to 20° as the inclined portion 116. In addition, a boundary between the intermediate portion 126 and the connection portion 118 is an edge of a portion in which the electrode 107 overlaps with the electrode 106 in a projection that is orthogonal to the surface 151 of the substrate 101. A planar portion of the intermediate portion 126 between boundaries thus defined may be the terrace portion 120.

Respective configurations of the semiconductor elements 100 to 600 may be used in combination as appropriate. For example, the configuration in which the via portion 127 is disposed may be applied to the semiconductor elements 100 to 300 in which the dielectric layer 121 has a single-layer structure as illustrated in FIGS. 1B, 3, and 4. By using the configurations of the semiconductor elements 100 to 600, it becomes possible to achieve both improvement in characteristics and improvement in reliability, as described above.

Figure 10A:
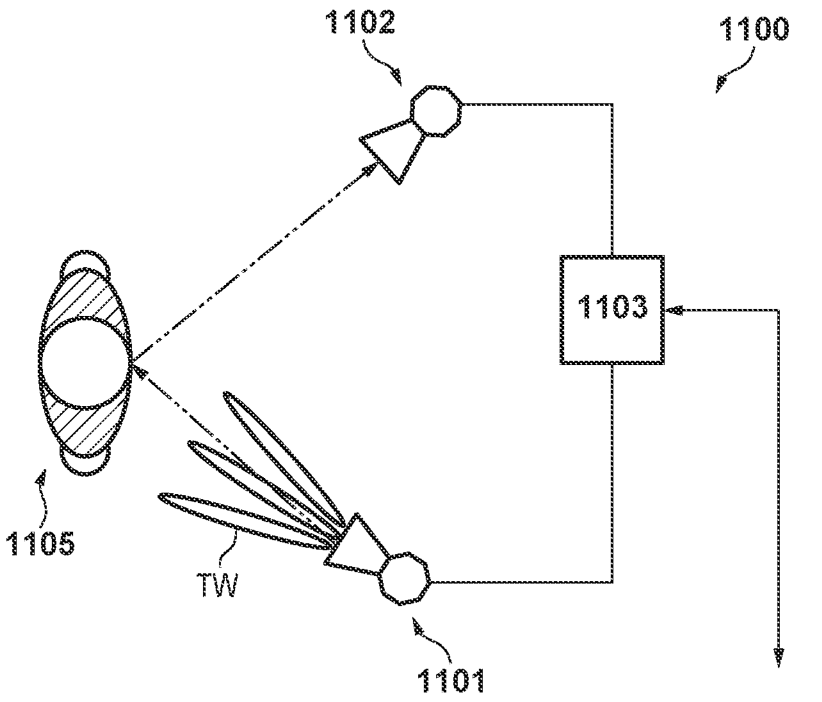
FIG. 10A is a diagram illustrating an example of a configuration of a terahertz wave system in which the semiconductor element is used.

Here, a terahertz wave system in which any one of the semiconductor elements 100 to 600 of the above-described embodiments is used will be described. Specifically, a case where a terahertz camera system (image capturing system) is assumed as the terahertz wave system will be described. For example, a semiconductor apparatus that includes the semiconductor elements 100 to 600 of the above-described embodiments and an antenna (patch antenna 108) is prepared. In the present embodiment, the semiconductor apparatus is used as a transmission unit (oscillator). A plurality of antennas may be arranged in the semiconductor apparatus. In the following, description will be given with reference to FIG. 10A. A terahertz camera system 1100 includes a transmission unit 1101 for radiating a terahertz wave and a reception unit (detection unit) 1102 for detecting a terahertz wave. Furthermore, the terahertz camera system 1100 includes a control unit 1103 for controlling the operation of the transmission unit 1101 and the reception unit 1102 based on a signal from the outside and processing an image based on a detected terahertz wave or outputting the image to the outside. The semiconductor elements 100 to 600 of the respective embodiments may be applied to the transmission unit 1101 and the reception unit 1102.

A terahertz wave emitted from the transmission unit 1101 is reflected off of a subject 1105 and is detected by the reception unit 1102. A camera system that includes such a transmission unit 1101 and a reception unit 1102 may be referred to as an active camera system. In a passive camera system in which there is no transmission unit 1101, the semiconductor elements 100 to 600 of the respective above-described embodiments can be used as the reception unit 1102.

In the present embodiment, a camera system has been described as a terahertz wave system; however, it is also possible to apply the terahertz wave system to a terahertz communication system (communication apparatus) in which a transmission unit that includes a semiconductor element is used.

Figure 10B:
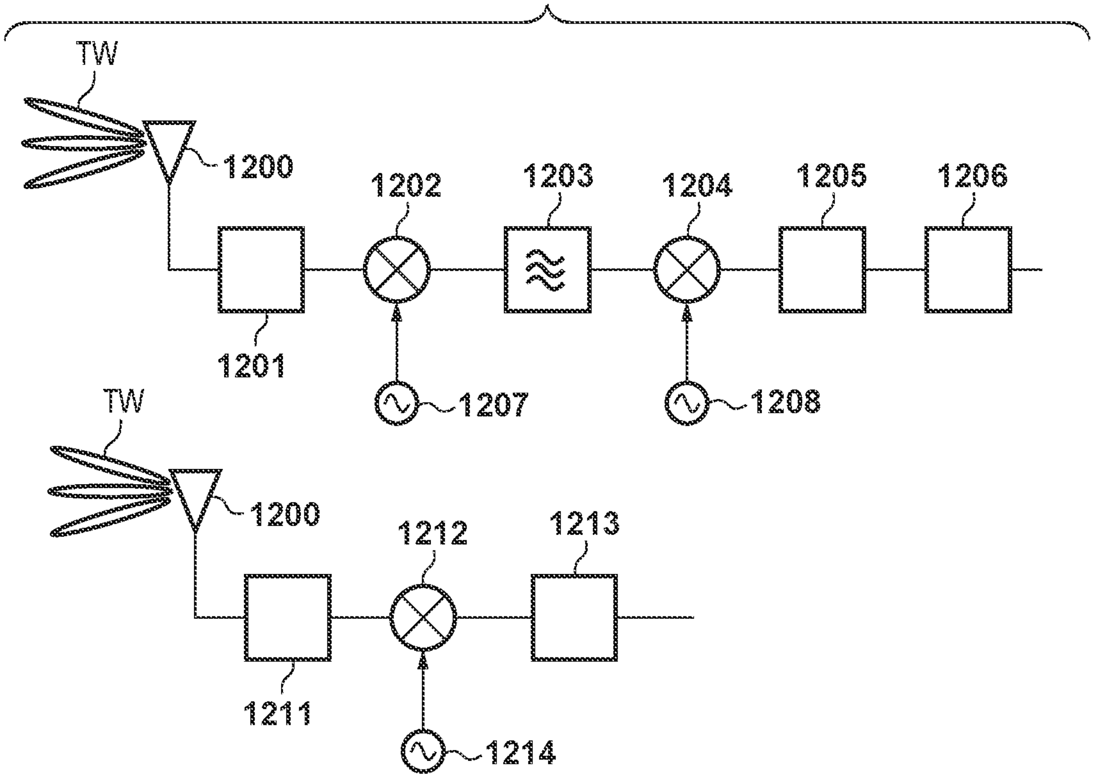
FIG. 10B is a diagram illustrating an example of a configuration of a communication system in which the semiconductor element is used.

In the following, an example in which a terahertz communication system (communication apparatus) is assumed as a terahertz wave system will be described with reference to FIG. 10B. A semiconductor apparatus in which the semiconductor element 100 to 600 of the above-described embodiments are used is used as an antenna apparatus. The antenna apparatus can be used as an antenna 1200 of the communication system. Those from a simple ASK method to superheterodyne, direct conversion, and the like are envisioned as the communication system. A superheterodyne communication system includes, for example, the antenna 1200, an amplifier 1201, a mixer 1202, a filter 1203, a mixer 1204, a converter 1205, a digital baseband modulator/demodulator 1206, and local oscillators 1207 and 1208. In a case of a receiver, a terahertz wave received via the antenna 1200 is converted to an intermediate frequency signal by the mixer 1202 and then converted to a baseband signal by the mixer 1204, and an analog waveform is converted to a digital waveform in the converter 1205. Then, a communication signal is obtained by demodulating that digital waveform in the baseband. In a case of a transmitter, after being modulated, a communication signal is converted from a digital waveform to an analog waveform by the converter 1205 and then frequency-converted via the mixer 1204 and the mixer 1202 and outputted as a terahertz wave from the antenna 1200. A direct conversion communication system includes the antenna 1200, an amplifier 1211, a mixer 1212, a modulator/demodulator 1213, and a local oscillator 1214. In a direct conversion method, at the time of reception, a received terahertz wave is directly converted into a baseband signal by the mixer 1212, and at the time of transmission, a baseband signal to be transmitted is converted into a terahertz band signal by the mixer 1212. Other configurations are similar to a superheterodyne method.

In the above, embodiments of the present invention have been described; however, the present invention is not limited to these embodiments, and various modifications and changes can be made within a scope of spirit thereof.

For example, in the above-described embodiments, description has been made envisioning electron charge carriers; however, the present invention is not limited thereto, and hole charge carriers are also possible. In addition, a material of the substrate or the dielectric may be selected depending on the application, and a layer of a semiconductor, such as silicon, gallium arsenide, indium arsenide, or gallium phosphorus, or resin, such as glass, ceramic, polytetrafluoroethylene, or polyethylene terephthalate, may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-161832, filed Oct. 6, 2022, and Japanese Patent Application No. 2023-127328, filed Aug. 3, 2023, which are hereby incorporated by reference herein in their entirety.

What is claimed is:

1. A semiconductor element operable to generate or detect a terahertz wave, the semiconductor element comprising:

a substrate; a first electrode; a semiconductor layer constituting, together with the first electrode, a mesa structure between a surface of the substrate and the first electrode and including a gain medium for a wavelength of a terahertz wave; a dielectric layer disposed so as to cover the substrate; and a second electrode disposed so as to cover the dielectric layer and connected to an upper surface of the first electrode via an opening provided in the dielectric layer, wherein a portion of the second electrode, the portion being disposed in the opening, includes a first inclined portion, a second inclined portion disposed between the first inclined portion and the first electrode and is smaller in inclination with respect to the surface of the substrate than the first inclined portion, and an intermediate portion connecting the first inclined portion and the second inclined portion, wherein the intermediate portion includes a planar terrace portion, wherein the terrace portion is smaller in inclination with respect to the surface of the substrate than the first inclined portion and the second inclined portion, and wherein a film thickness of the second inclined portion in a direction of a normal of a surface of the second inclined portion is thicker than a film thickness of the first inclined portion in a direction of a normal of a surface of the first inclined portion.

2. The semiconductor element according to claim 1, wherein a face of the terrace portion, the face contacting the dielectric layer, is parallel to the surface of the substrate.

3. The semiconductor element according to claim 1, wherein an inclination of a surface of the terrace portion is in a range of ±5° with respect to a virtual plane parallel to the surface of the substrate.

4. The semiconductor element according to claim 1, wherein a width of the terrace portion, the width being between the first inclined portion and the second inclined portion, is greater than a thickness of the semiconductor layer.

5. The semiconductor element according to claim 1, wherein a surface of the first inclined portion and a surface of the second inclined portion are flat surfaces or faces that continuously change in inclination.

6. The semiconductor element according to claim 1,
wherein the portion of the second electrode, the portion being disposed in the opening, includes a connection portion connected to the first electrode, and
wherein the opening includes a via portion in which the connection portion is embedded.

7. The semiconductor element according to claim 6,
a width of the via portion, the width being in a direction parallel to the surface of the substrate, is greater than a height of the via portion, the height being in a direction intersecting with the surface of the substrate.

8. The semiconductor element according to claim 6,
wherein the portion of the second electrode, the portion being disposed in the opening, includes a second intermediate portion connecting the second inclined portion and the connection portion,
wherein the second intermediate portion includes a planar second terrace portion, and
wherein the second terrace portion is smaller in inclination with respect to the surface of the substrate than the first inclined portion and the second inclined portion.

9. The semiconductor element according to claim 8, wherein a face of the second terrace portion, the face contacting the dielectric layer, is parallel to the surface of the substrate.

10. The semiconductor element according to claim 8, wherein an inclination of a surface of the second terrace portion is in a range of ±5° with respect to a virtual plane parallel to the surface of the substrate.

11. The semiconductor element according to claim 1, wherein the dielectric layer constitutes of a plurality of layers.

12. The semiconductor element according to claim 11, wherein the plurality of layers include layers, each constituting of a different material.

13. The semiconductor element according to claim 11, wherein the plurality of layers includes an organic material layer contacting the first inclined portion and an inorganic material layer contacting the second inclined portion.

14. The semiconductor element according to claim 1, wherein an inclination of the second inclined portion with respect to the surface of the substrate is less than or equal to 45°.

15. The semiconductor element according to claim 1, wherein an inclination of the second inclined portion with respect to the surface of the substrate is greater than or equal to 20°.

16. The semiconductor element according to claim 1, wherein an inclination of the first inclined portion with respect to the surface of the substrate is greater than 45°.

17. The semiconductor element according to claim 1, wherein the second inclined portion is disposed farther on a substrate side than half of a height of the opening.

18. The semiconductor element according to claim 1, wherein the first inclined portion includes a portion disposed farther on a substrate side than half of a height of the opening and a portion disposed on a side farther away from the substrate than half of the height of the opening.

19. The semiconductor element according to claim 1,
wherein a portion of the second electrode, the portion being disposed in the opening, includes a third inclined portion disposed farther on an upper end side of the opening than the first inclined portion and is larger in inclination with respect to the surface of the substrate than the first inclined portion, and a third intermediate portion connecting the first inclined portion and the third inclined portion,
wherein the third intermediate portion includes a planar third terrace portion, and
wherein the third terrace portion is smaller in inclination with respect to the surface of the substrate than the first inclined portion and the second inclined portion.

20. A terahertz wave system comprising:
a transmission unit including the semiconductor element according to claim 1; and
a detection unit configured to detect the terahertz wave emitted from the transmission unit.

21. A semiconductor element operable to generate or detect a terahertz wave, the semiconductor element comprising:
a substrate; a first electrode; a semiconductor layer constituting, together with the first electrode, a mesa structure between a surface of the substrate and the first electrode and including a gain medium for a wavelength of a terahertz wave; a dielectric layer disposed so as to cover the substrate; and a second electrode disposed so as to cover the dielectric layer and connected to an upper surface of the first electrode via an opening provided in the dielectric layer,
wherein a portion of the second electrode, the portion being disposed in the opening, includes a first inclined portion, a second inclined portion disposed between the first inclined portion and the first electrode and is smaller in inclination with respect to the surface of the substrate than the first inclined portion, and an intermediate portion connecting the first inclined portion and the second inclined portion,
wherein the intermediate portion includes a planar terrace portion,
wherein the terrace portion is smaller in inclination with respect to the surface of the substrate than the first inclined portion and the second inclined portion
wherein the portion of the second electrode, the portion being disposed in the opening, includes a connection portion connected to the first electrode,
wherein the opening includes a via portion in which the connection portion is embedded
wherein the portion of the second electrode, the portion being disposed in the opening, includes a second intermediate portion connecting the second inclined portion and the connection portion,
wherein the second intermediate portion includes a planar second terrace portion, and
wherein the second terrace portion is smaller in inclination with respect to the surface of the substrate than the first inclined portion and the second inclined portion.

22. A semiconductor element operable to generate or detect a terahertz wave, the semiconductor element comprising:
a substrate; a first electrode; a semiconductor layer constituting, together with the first electrode, a mesa structure between a surface of the substrate and the first electrode and including a gain medium for a wavelength of a terahertz wave; a dielectric layer disposed so as to cover the substrate; and a second electrode disposed so as to cover the dielectric layer and connected to an upper surface of the first electrode via an opening provided in the dielectric layer, wherein a portion of the second electrode, the portion being disposed in the opening, includes a first inclined portion, a second inclined portion disposed between the first inclined portion and the first electrode and is smaller in inclination with respect to the surface of the substrate than the first inclined portion, and an intermediate portion connecting the first inclined portion and the second inclined portion, wherein the intermediate portion includes a planar terrace portion, wherein the terrace portion is smaller in inclination with respect to the surface of the substrate than the first inclined portion and the second inclined portion wherein a portion of the second electrode, the portion being disposed in the opening, includes a third inclined portion disposed farther on an upper end side of the opening than the first inclined portion and is larger in inclination with respect to the surface of the substrate than the first inclined portion, and a third intermediate portion connecting the first inclined portion and the third inclined portion, wherein the third intermediate portion includes a planar third terrace portion, and wherein the third terrace portion is smaller in inclination with respect to the surface of the substrate than the first inclined portion and the second inclined portion.

* * * * *